United States Patent [19]

Nath et al.

[11] Patent Number: 4,704,369

[45] Date of Patent: * Nov. 3, 1987

[54] METHOD OF SEVERING A SEMICONDUCTOR DEVICE

[75] Inventors: Prem Nath, Rochester; Avtar Singh, Detroit, both of Mich.

[73] Assignee: Energy Conversion Devices, Inc., Troy, Mich.

[*] Notice: The portion of the term of this patent subsequent to Nov. 27, 2001 has been disclaimed.

[21] Appl. No.: 718,770

[22] Filed: Apr. 1, 1985

[51] Int. Cl.$^4$ ............................................. H01L 21/463
[52] U.S. Cl. ............................................. 437/226; 437/2
[58] Field of Search ............................. 29/583, 572; 136/258 AM, 244; 357/30

[56] References Cited

U.S. PATENT DOCUMENTS

| | | | |
|---|---|---|---|
| 2,444,255 | 6/1948 | Hewlett | 29/583 |
| 2,479,446 | 8/1949 | Wilson | 29/583 |
| 2,743,506 | 5/1956 | Solow | 29/583 |
| 3,015,374 | 1/1962 | Crouthamel | 29/583 |
| 4,245,386 | 1/1981 | Kausche et al. | 29/572 |
| 4,419,530 | 12/1983 | Nath | 29/572 |
| 4,485,264 | 11/1984 | Iyu et al. | 29/572 |

*Primary Examiner*—Olik Chaudhuri
*Attorney, Agent, or Firm*—Marvin S. Siskind; Richard M. Goldman

[57] ABSTRACT

An improved method for severing a large area semiconductor device, including a substrate having a base electrode region thereupon, semiconductor body and top electrode into smaller area devices includes the steps of supporting the semiconductor device from the top electrode side thereof and applying a cutting force to the substrate side of the semiconductor device so as to cut the device without establishing short circuit contact between the substrate electrode and the top electrode thereof. Also included is a large area semiconductor device having a protective layer affixed to the top electrode surface thereof. The large area device is readily adapted for severing into smaller area photovoltaic devices by the method disclosed herein.

9 Claims, 6 Drawing Figures

METHOD OF SEVERING A SEMICONDUCTOR DEVICE

FIELD OF THE INVENTION

This invention relates generally to large area photovoltaic devices and particularly to a method for severing large area solar cells into smaller portions. Also included within the scope of the instant invention is a supply of large area solar cell material adapted to be severed into smaller portions.

BACKGROUND OF THE INVENTION

Single crystal photovoltaic devices, especially silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

The instant invention includes a method for severing a large area solar cell into smaller portions without causing the short circuiting thereof.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intermediate range order or even contain, at times, crystalline inclusions. As used herein, the term "microcrystalline" is defined as a unique class of said amorphous material characterized by a volume fraction of crystalline inclusions, said volume fraction of inclusions being greater than a threshold value at which the onset of substantial changes in certain key parameters such as band gap, electrical conductivity and absorption constant occurs. It is to be noted that pursuant to the foregoing definitions a microcrystalline semiconductor alloy falls within the generic term "amorphous".

For many years, such work with amorphous silicon or germanium films was substantially unproductive because of the presence therein of microvoids and dangling bonds which produce a high density of localized states in the energy gap, which states are derogatory to the electrical properties of such films. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate maintained at a temperature of about 500-600 degrees K (227-327 degrees C.). The material so deposited on the substrate is an intrinsic amorphous material consisting of silicon and hydrogen. To produce a doped amorphous material an N-dopant such as phosphine gas ($PH_3$), or a P-dopant such as diborane $B_2H_6$) gas, is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare by glow discharge or vapor deposition thin film amorphous silicon or germanium alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," of Stanford R. Ovshinsky and Arun Madan which issued Oct. 7, 1980 and in U.S. Pat. No. 4,217,374, under the same title to Stanford R. Ovshinky and Masatsugu Izu, which issued on Aug. 12, 1980 and U.S. Pat. No. of Stanford R. Ovshinsky, David D. Allred, Lee Walter and Stephen J. Hudgens entitled "Method of Making Amorphous Semiconductor Alloys and Devices Using Microwave Energy," which patents are assigned to the assignees of the instant invention, the disclosure of which is incorporated herein by reference. As disclosed in these patents, it is believed that compensating agents such as fluorine and/or hydrogen introduced into the amorphous semiconductor operate to substantially reduce the density of the localized states therein and facilitate the addition of other alloying materials.

Since amorphous alloys may be readily deposited atop a wide variety of substrates and over large areas, it is now possible to readily fabricate multiple cell stacked photovoltaic structures. The concept of utilizing multiple cells, to enhance photovoltaic device efficiency, was discussed at least as early as 1955 by E. D. Jackson, in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. As the assignee of the instant invention has shown, such tandem structures are not only possible, but can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon alloys can be deposited in multiple layers over large area substrates to form solar cells in a high volume, continuous processing system. Such continuous processing systems are disclosed in the following U.S. patents: U.S. Pat. No. 4,400,409, for A Method of Making P-Doped Silicon Films And Devices Made Therefrom, U.S. Pat. No. 4,410,588, for Continuous Amorphous Solar Cell Deposition And Isolation System And Method; and pending U.S. patent applications: Ser. No. 244,386, filed Mar. 16, 1981, for Continuous Systems For Depositing Amorphous Semiconductor Material; Ser. No. 359,825, filed Mar. 19, 1982, for Method And Apparatus For Continuously Producing Tandem Amorphous Photovoltaic Cells; and Ser. No. 460,629 filed Jan. 24, 1983 for Method And Apparatus For Continuously Producing Tandem Amorphous Photovoltaic Cells. As disclosed in these Patents and applications, the disclosure of which is incorporated herein by reference, a substrate may be continuously advanced through a succession of deposition chambers, wherein each chamber is dedicated to the deposition of a specific semiconductor material. In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity; (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a wide variety of photovoltaic devices including one or more n-i-p cells, one or more p-i-n cells, a Schottky barrier device, photodialas, phototransistors, or the like. Additionally, by making multiple passes through the succession of deposition chambers, or by providing an additional array of deposition chambers multiple stacked cells of various configurations may be obtained.

While in some cases it is desirable to utilize the thus produced photovoltaic material in the form of a large area device, in other cases it is necessary to cut or sever large area photovoltaic material into smaller photovoltaic cells. It should be noted at this point that the term "severing" as used herein is meant to include cutting, shearing, punching, die cutting, slitting or any other process which penetrates the semiconductor device. Such smaller area cells have utility in consumer applications such as power sources for calculators, watches, toys and small electrical appliances. Also, if a roll-to-roll process is utilized for the continuous production of photovoltaic devices, it is necessary to sever that roll to produce discrete photovoltaic cells. And, if it is desired to produce large area power generation modules from the photovoltaic material, it is necessary to cut that material into smaller portions which will subsequently be electrically interconnected.

The typical thin film photovoltaic cell, which is the subject of the instant invention will be described in greater detail hereinbelow; however, such a cell includes a substrate, which forms the base electrode or has a base electrode region thereupon, a semiconductor body deposited atop the base electrode and a relatively transparent electrically conductive top electrode member. Top electrode members are generally formed of a transparent oxide material such as indium tin oxide, tin oxide, indium oxide, cadmium stannate and zinc oxide.

Problems are encountered in severing a photovoltaic cell of this type because the cutting process tends to produce one or more short circuit current paths which establish electrical communication between the top electrode and the base electrode of the photovoltaic device. It has generally been found by applicants that the transparent conductive oxide material is relatively brittle and tends to form a plurality of shards when subjected to a shearing force in the cutting process. These shards penetrate through or bridge across the semiconductor body and establish a short circuit current path between the remainder of the top electrode material and the electrically conductive base electrode. Obviously, the shorted photovoltaic cell is of no practical utility.

Several approaches to this problem have heretofore been implemented so as to allow for severing of the large area photovoltaic material. However, these processes are time and labor intensive and tend to waste photovoltaic material. For example, as disclosed in U.S. Pat. No. 4,419,530 entitled Solar Cell And Method For Producing Same, which patent is assigned to the assignee of the instant invention and the disclosure of which is incorporated herein by reference, various "scribing" methods may be utilized to remove portions of the transparent conductive oxide layer from the photovoltaic cell in regions which are to be cut. In this manner, the problem of short circuiting by the shards is obviated. Among the scribing techniques are (a) chemical etching techniques, (b) plasma etching techniques, (c) laser scribing techniques, (d) water jet techniques and (e) the use of masking techniques during the deposition of the transparent conductive oxide top electrode layer. While all of these techniques do work they necessitate extra processing steps, and in some cases rely upon the use of bulky and/or expensive additional hardware. Furthermore, the aforementioned technique is a two step process which requires that (1) a TCO free pattern first be formed and (2) cutting take place along that pattern. These process steps require good alignment techniques for both the scribing and cutting steps if an economical production yield of cut device be attained.

As disclosed in U.S. Pat. No. 4,485,264 entitled Isolation Layer For Photovoltaic Device And Method Of Producing Same, which patent is also assigned to the assignee of the instant invention and the disclosure of which is incorporated herein by reference, the semiconductor body of a photovoltaic cell may be provided with TCO free regions by first forming a pattern of relatively thick, electrically insulating silicone material thereupon prior to the deposition to the TCO layer. The thick insulating layer prevents the formation of a continuous TCO layer thereacross and thus provides electrically isolated regions in which severing may take place without the creation of short circuit current paths. As in the previously described technique, this process requires fairly precise alignment and necessitates extra steps in the processing in the photovoltaic cells. Furthermore both of the aforementioned techniques of necessity dictate a predetermination of precisely where the photovoltaic material will be severed. Therefore fabrication of a large area roll of photovoltaic material adapted to be configured in a variety of later-to-be-determined shapes is not possible employing these previously utilized techniques.

Clearly then, it is highly desirable to have a technique for severing semiconductor material, particularly large area photovoltaic devices, into small area photovoltaic cells without producing short circuits therein. This technique should not require the use of any complicated or extraneous hardware, nor should it impose any additional process steps on the fabrication of the semiconductor material. Additionally it would be highly desirable to have a technique for severing large area semiconductor material by which cuts may be made at any desired location thereupon. Utilizing such a severing technique, a large area supply of photovoltaic material may be maintained by manufacturers for later configuration into a diverse variety of smaller area photovoltaic cells.

The instant invention provides such a severing technique. According to the principles of the instant invention, which will be fully described hereinbelow, photovoltaic or other semiconductor material may be readily severed into smaller area cells without the necessity of removing any portion of the upper TCO electrodes thereof and without producing any short circuits therein. Since the technique does not require any scribing or any other removal of the TCO, extra processing steps are eliminated and precise alignment need not be maintained during the cutting process. The instant invention also makes possible the manufacture of a large area supply of photovoltaic material adapted for the ready cutting thereof into variously configured smaller area devices. These and other advantages of the instant invention will be more fully detailed and explained by the drawings, the description thereof and the claims which follow.

BRIEF DESCRIPTION OF THE INVENTION

The instant invention provides a method of cutting a semiconductor device of the type comprising: a substrate having a base electrode region thereupon, a semiconductor body disposed upon the base electrode and a transparent, electrically conductive top electrode deposited atop the semiconductor body. The method includes steps of: providing means for supporting the top electrode side of the semiconductor device; disposing shearing means proximate the substrate side of the semiconductor device and activating the shearing means so as to apply a shearing force to the semiconductor device from the substrate side thereof. In this manner the device is cut without establishing short circuit contact between the substrate electrode and the top electrode. In one embodiment of the instant invention a protective member such as a sheet of cardboard, paper or synthetic polymer may be disposed between the top electrode side of the semiconductor device and the support means so as to prevent damage to the top electrode during the cutting. In some cases the support means and the protective layer may be one in the same. In other cases the protective member may be removably affixed as by contact adhesive to the top electrode surface of the semiconductor device. In still other cases, the protective member may be formed of a transparent encapsulant material adapted to remain in place during the operating lifetime of the device.

In some embodiments of the instant invention the support means is provided only proximate the portion of the device which is to be cut, whereas in other cases the support means is disposed everywhere atop the semiconductor device as for example in the instance where the support member is a resilient member and the step of activating the shearing means includes the further step of cutting through the semiconductor device and into the resilient member. According to one embodiment of the instant invention the transparent electrically conductive top electrode of the semiconductor device is formed from a relatively brittle transparent conductive oxide member and the step of shearing causes the transparent conductive oxide material to shatter in the region where the shearing force is supplied so as to prevent short circuiting.

The instant invention also provides a large area semiconductor device adapted for severing into small area devices. The large area device includes a substrate having a base electrode region thereupon, a semiconductor body disposed upon the substrate in electrical contact with the base electrode region, a top electrode member formed from a relatively transparent electrically conductive material disposed upon an electrical contact with the semiconductor body and protective means removably affixed to at least a portion of the exposed surface of the top electrode.

I. THE PHOTOVOLTAIC CELL

Figure 1:
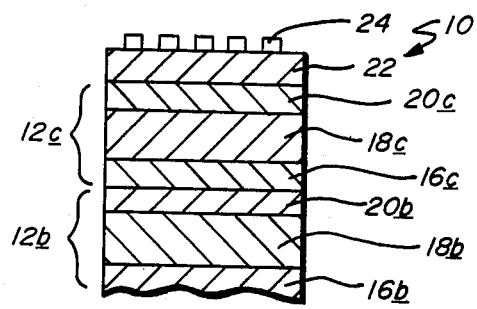
FIG. 1 is a fragmentary, cross-sectional view of a tandem photovoltaic device, of the type which may be employed in the practice of the instant invention, and comprising a plurality of n-i-p type photovoltaic cells.
Figure 1:
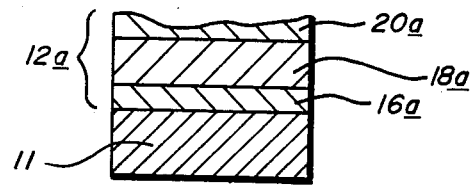

Referring now to the drawings and particularly to FIG. 1, a photovoltaic cell, formed of a plurality of successive n-i-p layers, each of which includes, preferably, an amorphous thin film semiconductor alloy material is shown generally by the reference numeral 10.

More particularly, FIG. 1 shows an n-i-p type photovoltaic device such as a solar cell made up of individual n-i-p type cells 12a, 12b and 12c. Below the lowermost cell 12a is a substrate 11 which may be formed of a transparent glass or synthetic polymeric member; or formed from a metallic material such as stainless steel, aluminum, tantalum, molybdenum, chrome; or formed from metallic particles embedded within an insulator. Although certain applications may require deposition of a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymers and, metals coated with a synthetic polymer to which one or more conductive base electrodes are applied.

Each of the cells 12a, 12b and 12c are preferably fabricated with a thin film semiconductor body containing at least a silicon or silicon:germanium alloy. Each of the semiconductor bodies incudes a p-type conductivity semiconductor layer 20a, 20b and 20c; a substantially intrinsic semiconductor layer 18a, 18b and 18c; and an n-type conductivity semiconductor layer 16a, 16b and 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Similarly, the tandem cell may include only two stacked cells. Also, althouqh n-i-p photovoltaic cells are illustrated, this invention may be advantageously practiced with differently configured photovoltaic cells including single or multiple p-i-n cells, schottky barrier cells, p-n cells as well as with any other semiconductor device having an appropriate top electrode. The term "n-i-p type" as used herein is meant to include any aggregation of n, i and p layers operatively disposed to provide a photoactive region for generating charge carriers in response to the absorption of photon energy.

It is to be understood that following the deposition of the semiconductor alloy layers, a further deposition process may be either performed in a separate environment or as a part of a continuous process. In this step, a TCO (transparent conductive oxide) layer 22, preferably formed of a material such as tin oxide, indium oxide, indium tin oxide, zinc oxide, cadmium stannate or combinations thereof is added atop the p-layer 20c of the top most cell 12c, to function as the top electrode of the cell 10. An electrode grid 24 may be added to the device where the cell is of a sufficiently large area, or if the conductivity of the TCO layer 22 is insufficient to assume efficient collection of photogenerated current. The grid 24 is adapted to shorten the carrier path and increase the conduction efficiency. As discussed previously, the intrinsic layers 18a, 18b and 18c of the cells 12a, 12b and 12c may be formed from alloy materials having different band-gaps. For example, 18c may have a band gap of approximately 1.7 eV, 18b may have a band gap of approximately 1.5 eV and 18a may have a band gap approximately 1.3 eV. In this manner, most efficient use may be made of a large portion of the incident solar spectrum.

II. THE MULTIPLE GLOW DISCHARGE DESPOSITION CHAMBERS

Figure 2:
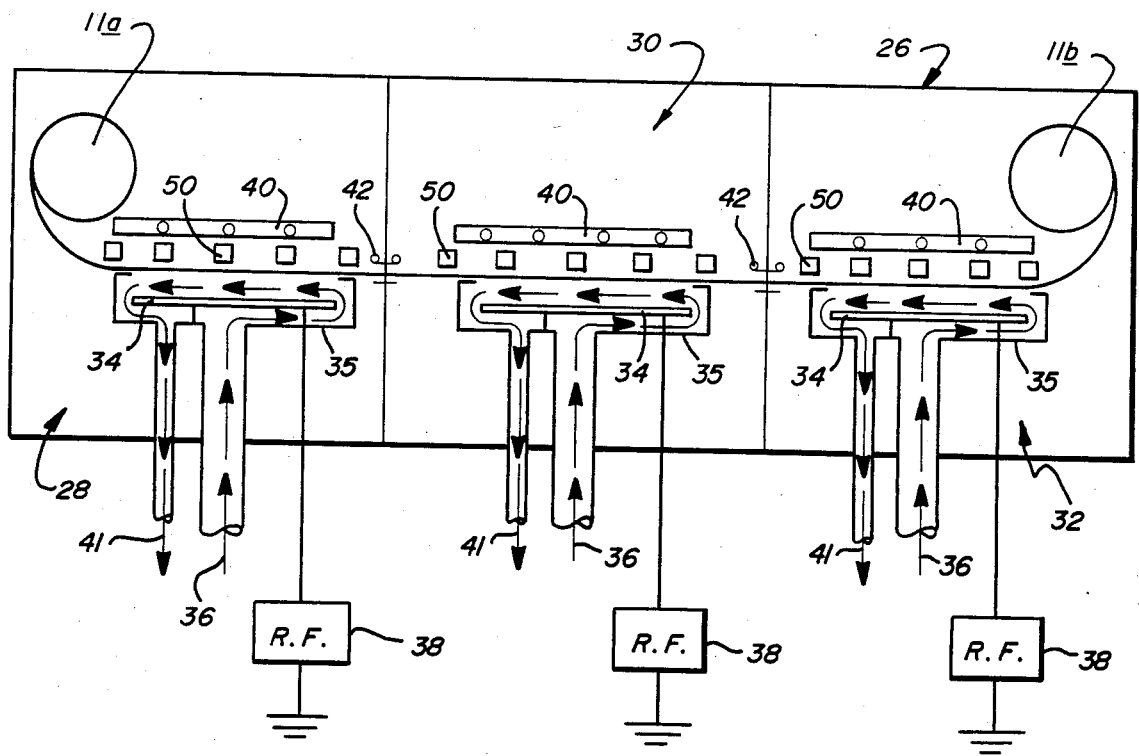
FIG. 2 is a schematic view of a multiple chamber deposition apparatus of the type which may be employed for the fabrication of the tandem photovoltaic cell of FIG. 1.

Turning now to FIG. 2, a diagrammatic representation of multiple glow discharge chamber deposition apparatus for the continuous production of semiconductor cells is generally illustrated by the reference numeral 26. The apparatus 26 includes a plurality of isolated, dedicated deposition chambers, each chamber of which is interconnected by a gas gate 42 through which (1) sweep gases, and (2) a web of substrate material 11 are adapted to unidirectionally pass. It is in an apparatus of this type that photovoltaic cells similar to the cell 10 of FIG. 1, may be readily manufactured.

The apparatus 26 is adapted to mass deposit amorphous semiconductor layers of n-i-p configuration onto the surface of the web of substrate material 11 which is continually fed therethrough. To deposit the semiconductor layers required for producing multiple n-i-p type cells, the apparatus 26 includes at least one triad of deposition chambers. Each triad of deposition chambers comprises: a first deposition chamber 28 in which an n-type conductivity semiconductor layer is deposited onto the deposition surface of the substrate 11 as the substrate 11 passes therethrough; a second deposition chamber 30 in which an intrinsic semiconductor layer is deposited atop the p-type layer on the deposition surface of the substrate 11 as the substrate 11 passes therethrough; and a third deposition chamber 32 in which a p-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional individual chambers may be added to the apparatus to provide the machine with the capability of producing photovoltaic cells having any number of n-i-p type semiconductor layers; (2) the substrate supply core 11a and the substrate take-up core 11b are shown in the deposition chambers for illustrative purposes only, while in reality the cores would be housed in separate chambers operatively connected to the deposition chambers; (4) although the glow discharge illustrated herein employs cathodes with r.f. power, other energy supplies, such as a.c. power generators, microwave generators and d.c. power generators, may be employed without departing from the spirit of the present invention; and (5) the gaseous precursor source of semiconductor alloy material may be introduced to flow in a direction transverse, parallel or parallel but opposite to the direction of substrate travel.

Each deposition chamber, 28, 30 and 32 of the triad is adapted to deposit a single semiconductor layer, by glow discharge deposition, onto the electrically conductive substrate 11. To that end, each of the deposition chambers 28, 30 and 32 includes: a cathode 34; a shield 35 disposed about each of the cathodes 34; a process gas supply conduit 36; a radio frequency generator or other source of electromagnetic power 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber.

The supply conduits 36 are operatively associated with the respective cathodes 34 or other decomposition mechanism to deliver process gas mixtures to the plasma, or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers.

The radio frequency or other similar type of power generator 38 operates in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel.

To form the photovoltaic cell 10 illustrated in FIG. 1, an n-type amorphous semiconductor layer is deposited onto the substrate 11 in the dopant deposition chamber 28, an intrinsic amorphous semiconductor layer is deposited atop the n-type layer in the deposition chamber 30 and a p-type amorphous semiconductor layer is deposited atop the intrinsic layer in the deposition chamber 32. As a result, in the preferred embodiment, the apparatus 26 deposits at least three amorphous semiconductor layers onto the substrate 11 with the intrinsic layer deposited in deposition chamber 30 differing in composition from the layers deposited in deposition chambers 28 and 32 by the absence of at least one element which will be referred to as the dopant or doping species.

III. SEVERING THE SEMICONDUCTOR DEVICE

As discussed previously, it is frequently desirable to sever the large area photovoltaic material, produced in a process such as the continuous deposition process discussed with reference to FIG. 2, into smaller area photovoltaic cells. Heretofore, severing processes were fairly complex because of the necessity of avoiding the creation of short circuit current paths by the cutting process. The method of the present invention, which is schematically illustrated with reference to FIGS. 3A and 3B provides a simple cutting process for severing the photovoltaic cells which does not necessitate scribing, masking or other removal of the transparent conductive oxide.

Figure 3A:
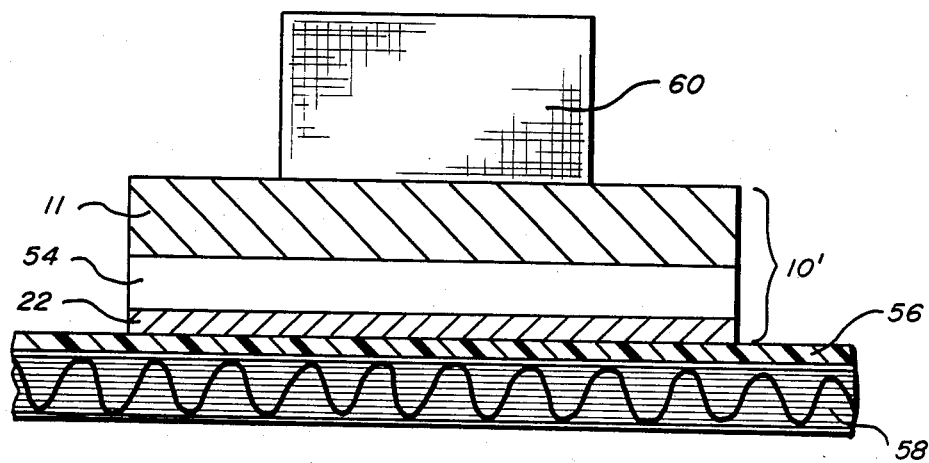
FIG. 3A is a cross-sectional view of a photovoltaic cell as disposed for severing into a smaller area cell.
Figure 3B:
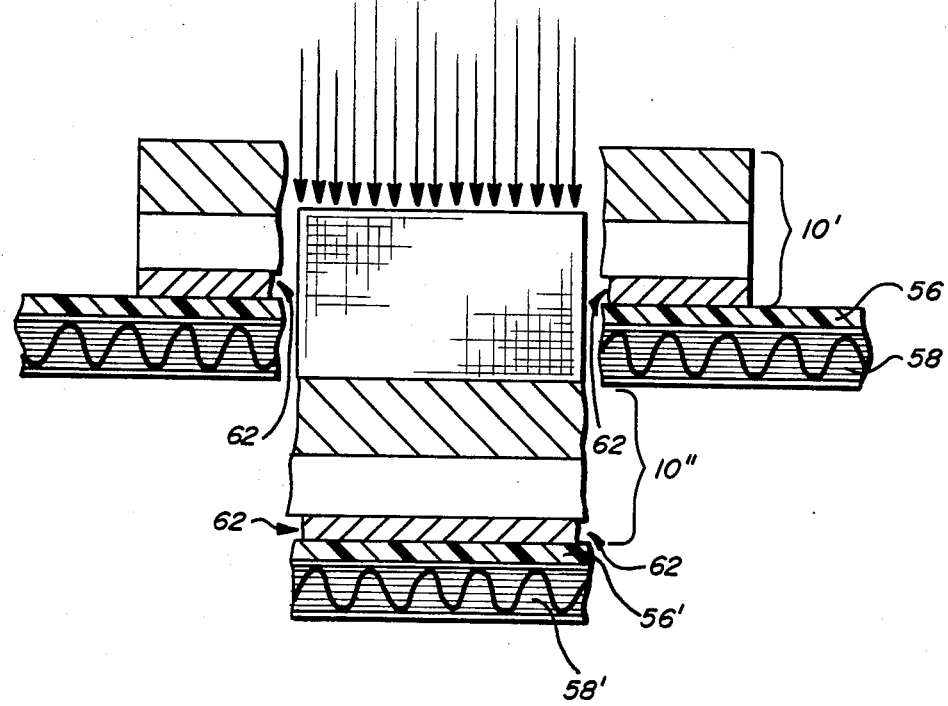
FIG. 3B is a cross sectional view of the photovoltaic cell of FIG. 3A after severing.

Referring now to FIG. 3A, there is illustrated a photovoltaic cell 10' disposed for cutting. The cell 10' is generally similar to the photovoltaic cell 10 illustrated with reference to FIG. 1 however, for purposes of simplicity various semiconductor layers thereof are collectively referred to herein as a semiconductor body 54, it being understood that this body 54 is representative of any semiconductor body. The photovoltaic cell 10' of FIG. 3A also includes a substrate 11 generally similar to those previously described as well as a top electrode layer 22 also as previously described.

A protective layer 56 is disposed in contact with the top electrode 22 of the photovoltaic device 10'. This protective layer 56, functions to prevent mechanical damage to the top electrode 22 during severing operations and subsequent handling steps, and in some cases during the operative lifetime of the device. The protective layer 56 may be formed from a wide variety of materials such as, by way of example, a thin film of polyethylene, vinyl, a transparent encapsulant or other synthetic polymers, paper, cardboard, and so forth. The protective layer 56 may, in some cases be adhesively affixed to the top electrode layer 22 with a peelable adhesive, although in other cases the protective layer 56 may simply be disposed in contact with the top electrode 22. There is also disposed a support member 58 proximate the top electrode surface 22 of the photovoltaic device 10', which support member 58 functions to provide mechanical support to the photovoltaic device 10 during the cutting steps. As illustrated in FIG. 3A the support member 58 is formed of corrugated cardboard and thus may be considered a resilient member which is adapted to cushion the photovoltaic device 10' during the cutting thereof. Other resilient support members would include rubber, plastics, paper, and the like.

Although FIG. 3A illustrates a resilient support member 58 which is adapted to itself be severed to at least a degree during the severing the photovoltaic device, the instant invention is not limited to the use of such a support member. It may be advantageous in some cases to employ a support member which itself is quite rigid, as for example, a cutting die, or the stationary block of a shear press. If a rigid support member is utilized, it will be disposed in relatively close proximity to the edge of the photovoltaic device 10' which will be cut.

As illustrated in the embodiment of FIG. 3A, a cutting die 60 is disposed in proximately to the substrate side of the semiconductor device 10'. It is this cutting die 60 which will actually sever the photovoltaic device 10'.

Referring now to FIG. 3B, there is shown the same cutting die and photovoltaic device 10' as in FIG. 3A immediately following the severing step. As will be obvious in FIG. 3B, a force has been applied to the cutting die 60 causing it to "punch out" a portion 10" of the photovoltaic cell 10'. It will also be noted that a portion 58' of the resilient support member 58 and a portion of 56' of the protective layer 56 have also been punched out along with the smaller cell 10". It should be noted that for purposes of illustration the vertical scale of the photovoltaic device 10' has been exaggerated relative to that of the protective layer 56 and the support layer 58. In reality the total thickness of the photovoltaic cell 10' is generally not more than 10 mils, whereas the support member 58 is generally 4–5 mm thick. In such cases, the severing step does not usually punch completely through the cardboard support member 58 but rather only partially severs the cardboard and embeds the cut portion 10" of the cell into the cardboard support member 58, from which it may be removed.

What is especially notable about the illustration of 3B, is the fact that portions of the top electrode layer 22 proximate the cut edges of the photovoltaic cell of 10' and the cut portion thereof 10" are gone. As illustrated, there is a region 62 devoid of the TCO electrode material proximate the cut edges. Applicants have found that when a semiconductor device having a TCO electrode is cut from the rear surface thereof portions of that electrode proximate the cut edge shatter and the shards thereof fall away from the cut regions thereby producing the electrode material free zone 62. It is the creation of this electrode free zone 62 which allows the semiconductor device to be severed without short circuiting. If the same device were cut from the top surface thereof, shards of TCO material will penetrate the semiconductor body and establish a short circuit current path to the substrate electrode of the semiconductor device. In a similar manner, a semiconductor device having a top electrode formed of a less brittle material may be cut. While a less brittle electrode material will not necessarily shatter and fall away; rear surface cutting of a device will prevent such a resilient or flexible electrode material from being "smeared" into the base electrode.

Figure 4:
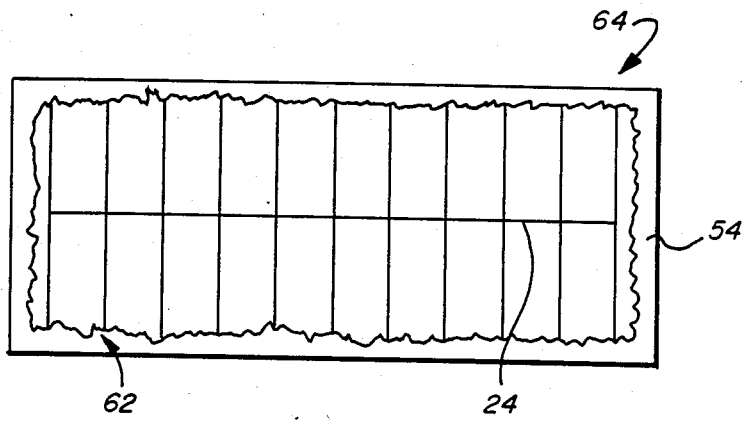
FIG. 4 is a top plan view of a small area photovoltaic cell, severed from a larger area photovoltaic cell by the techniques of the instant invention and illustrating the formation of a TCO free region along the periphery thereof; and, FIG. 5 is a perspective view of a die-cutting station as operatively disposed to sever the large area semiconductor material of the instant invention into a plurality of small area devices.

Referring to FIG. 4, there is illustrated a top plan view of a representative small area photovoltaic cell 64 which has been severed in accord with the principles of the instant invention. The cell 64 is generally similar to the cut small area cell 10" of FIG. 3B. As illustrated, the cell 64 of FIG. 4 includes a TCO upper electrode 22, having a grid pattern 24 disposed thereatop. Notable in the illustration of FIG. 4, is a TCO free zone 62 formed about the periphery of the cell 64. Visible in this zone 62 is a portion of the underlying semiconductor body 54.

According to the principles of the instant invention there may be provided a supply of large area photovoltaic cell material having a protective layer adhesively affixed to or even extruded or screen printed onto the top electrode surface thereof. This supply of material which may be the form of sheets or a roll is readily adapted for severing into smaller area photovoltaic cells by the principles disclosed herein. Such a supply of material may be configured into a wide variety of photovoltaic cells as needed at a later time without the necessity for any scribing, etching, masking or other pre-cutting patterning.

Figure 5:
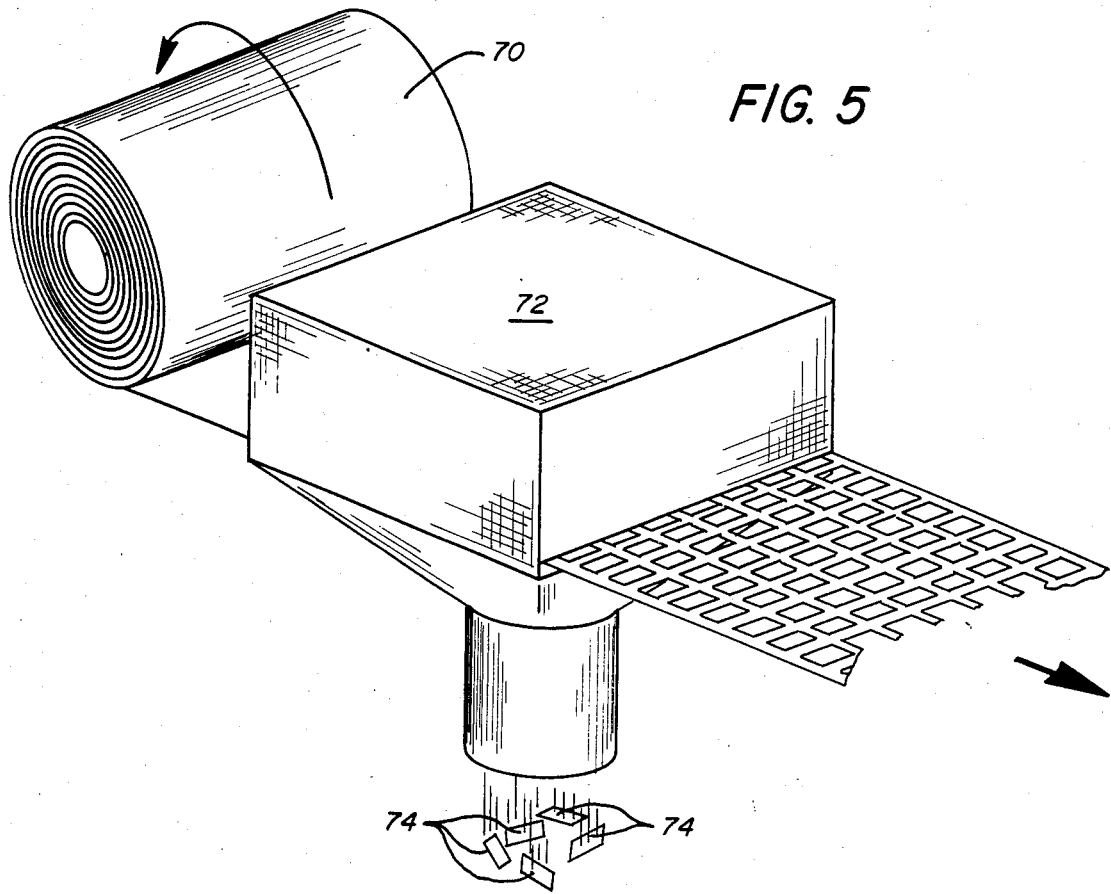

Referring to FIG. 5 there is illustrated one proposed mode for the use of such a roll of photovoltaic material. As illustrated in the figure, the roll 70 of photovoltaic material having a protective layer attached thereto is continuously fed to a die cutting station 72 in which die cutting methodology well known to those skilled in the art is employed to cut a plurality of smaller area photovoltaic cells 74 therefrom. As shown in the picture the cut smaller area cells 74 exit one portion of the die cutting station at which point may be collected by means such as a conveyer belt, a container or a chute and forwarded to subsequent work stations for utilization. The remainder of the roll of photovoltaic material from which the cells 74 have been cut proceeds out of the die cutting station to be scrapped, reclaimed or otherwise utilized.

It should be noted that by adhesively affixing the protective member to the roll of photovoltaic material, that material is protected during the cutting and handling thereof. Furthermore the smaller area cells cut from the roll of material having the protective layer retain that layer. Therefore the cells may be subsequently handled, stored or otherwise manipulated without danger of damage thereto. When the cells are finally ready to be utilized, their protective coating may be readily removed by peeling it away. In some instances, the protective layer may also function as an encapsulant for the photovoltaic cell. In such applications, the protective layer (1) will be formed from a transparent encapsulant material and (2) may be provided with one or more openings therein for the purpose of establishing electrical contact to the cell.

It should be noted that the instant invention may be practiced other than illustrated herein. For example, top electrode materials other than TCO materials may be similarly employed. Furthermore, while the discussion was primarily oriented toward severing photovoltaic cells, the instant invention may obviously be practiced with any type of semiconductor device in which (1) short circuiting must be prevented and (2) the electrode material behaves in a manner similar to the manner described for the TCO material. For example, large area memory arrays, large area integrated circuits, large area liquid crystal displays and similar devices may be severed according to the principles of the instant invention. While the discussion herein primarily concerned the cutting of devices with metallic substrates, the instant invention is obviously not so limited but may be practiced with devices having substrates of synthetic polymers, ceramics and the like provided (1) they have at least one electrically conductive base electrode region thereon communicating with the semiconductor body of the device and (2) they are capable of being cut.

The foregoing drawings, description and discussion were merely meant to be illustrative of some particular embodiments of the instant invention. It is the claims that follow, including all the equivalents, which define the scope of the invention.

What we claim is:

1. A method of cutting a semiconductor device of the type comprising: a substrate having a base electrode region thereupon, a semiconductor body formed of p-i-n layers of thin film semiconductor alloy material; said body disposed upon the base electrode and a transparent, electrically conductive top electrode formed of a relatively brittle transparent conductive oxide material deposited atop the semiconductor body, the method including the steps of:
   providing means for supporting the top electrode side of the semiconductor device;
   disposing shearing means proximate the substrate side of said semiconductor device;
   activating said shearing means, without first removing the portion of the top electrode and semiconductor body along which the device is to be cut, so as to apply a shearing force to the semiconductor device from the substrate side thereof; whereby the transparent conductive oxide material shatters in the region proximate to where the shearing force is applied and said shearing force cuts serially through the substrate, the semiconductor body and the top electrode without extablishing short circuit contact between the base electrode and the top electrode.

2. A method as in claim 1, including the further step of disposing a protective member between the top electrode side of the semiconductor device and the support means.

3. A method as in claim 2, wherein the step of providing a protective member comprises providing a sheet of material chosen from the group consisting of: cardboard, paper, synthetic polymeric materials, and combinations thereof.

4. A method as in claim 2, wherein the step of providing a protective member includes the further step of removably affixing said protective member to the top electrode surface of the semiconductor device.

5. A method as in claim 1, wherein the step of providing support means includes providing means adapted to both support the semiconductor device and protect the top electrode side thereof.

6. A method as in claim 1, wherein the step of providing supporting means comprises providing a resilient member disposed to support substantially the entirety of the semiconductor device; and the step of activating the shearing means includes the further step of cutting through the device and into at least a portion of the resilient member.

7. A method as in claim 1, wherein the step of providing support means comprises providing said means proximate the portion of the device which is to be cut.

8. A method as in claim 1, wherein the step of disposing shearing means includes disposing a cutting blade proximate the substrate side of the semiconductor device.

9. A method as in claim 1, wherein the step of disposing shearing means comprises disposing a die punch proximate the substrate side of the semiconductor device.

* * * * *